(12) United States Patent
Kang et al.

(10) Patent No.: US 8,826,880 B2
(45) Date of Patent: Sep. 9, 2014

(54) VALVE FOR ENGINE AND METHOD FOR TREATING SURFACE THEREOF

(75) Inventors: Young Joon Kang, Seoul (KR); Sung Chul Cha, Seoul (KR); Chang Hyun Shin, Incheon (KR); Jun Seok Lee, Incheon (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 288 days.

(21) Appl. No.: 13/482,150

(22) Filed: May 29, 2012

(65) Prior Publication Data

US 2013/0220262 A1 Aug. 29, 2013

(30) Foreign Application Priority Data

Feb. 29, 2012 (KR) .................. 10-2012-0021507

(51) Int. Cl.
*F01L 3/02* (2006.01)

(52) U.S. Cl.
USPC ........................ 123/188.3; 428/697

(58) Field of Classification Search
CPC .......... F01L 3/02; F01L 3/04; F01L 2101/00; B22F 7/00; B22F 7/02; B22F 7/04; C23C 14/0658; C23C 14/0664; C23C 28/00; C23C 28/027; C23C 28/028
USPC ............. 123/188.3; 29/888.45; 428/216, 334, 428/336, 697–699
See application file for complete search history.

(56) References Cited

U.S. PATENT DOCUMENTS

| | | | | |
|---|---|---|---|---|
| 5,503,912 A | * | 4/1996 | Setoyama et al. | ............ 428/216 |
| 5,679,448 A | * | 10/1997 | Kawata | .......................... 428/216 |
| 5,882,777 A | * | 3/1999 | Kukino et al. | ................ 428/216 |
| 6,232,003 B1 | * | 5/2001 | Ogawa et al. | ................. 428/698 |
| 6,309,738 B1 | * | 10/2001 | Sakurai | ......................... 428/216 |
| 6,492,011 B1 | * | 12/2002 | Brandle et al. | ................ 428/217 |
| 7,008,688 B2 | | 3/2006 | Toihara | |
| 7,462,375 B2 | * | 12/2008 | Ge | .......................... 427/255.15 |
| 7,713,612 B2 | | 5/2010 | Hanyu et al. | |
| 7,914,856 B2 | * | 3/2011 | Deng et al. | ..................... 427/450 |
| 8,021,768 B2 | * | 9/2011 | Ge | ................. 428/698 |
| 8,541,101 B2 | * | 9/2013 | Chang et al. | ................. 428/336 |
| 2001/0008707 A1 | | 7/2001 | Eerden et al. | |

(Continued)

OTHER PUBLICATIONS

Hovsepian et al., "CrAlYCN/CrCN nanoscale multilayer PVD coatings deposited by the combined High Power Impulse Magnetron Sputtering/Unbalanced Magnetron Sputtering (HIPIMS/UBM) technology", Surface & Coatings Technology, vol. 203, pp. 1237-1243 (2009).

(Continued)

*Primary Examiner* — Hung Q Nguyen
(74) *Attorney, Agent, or Firm* — Edwards Wildman Palmer LLP; Peter F. Corless

(57) ABSTRACT

The present invention provides a valve for an engine and a method for treating the surface thereof. The valve for the engine includes a buffer layer, an intermediate layer, a TiAlN/CrN first nanostructured multilayer, and a TiAlCN/CrCN second nanostructured multilayer. The buffer layer is coated over a surface of a stem part as a lowermost layer and is formed of Ti or Cr. The intermediate layer is coated over the buffer layer and is formed of CrN, TiN, or TiCN. The TiAlN/CrN first nanostructured multilayer is coated over the intermediate layer. The TiAlCN/CrCN second nanostructured multilayer is coated over the TiAlN/CrN first nanostructured multilayer as an uppermost layer.

15 Claims, 6 Drawing Sheets

(56) References Cited

U.S. PATENT DOCUMENTS

2004/0005981 A1* 1/2004 Weber et al. ............... 501/98.4
2007/0099027 A1* 5/2007 Krishnamurthy et al. .... 428/698
2007/0237985 A1 10/2007 Xu et al.
2011/0045264 A1* 2/2011 Heutling et al. ............. 428/216

OTHER PUBLICATIONS

Larbi et al., "Fretting wear of multilayered PVD TiAlCN/TiAlN/TiAl on AISI 4140 steel", Surface & Coatings Technology, vol. 201, pp. 1511-1518 (2006).

* cited by examiner

VALVE FOR ENGINE AND METHOD FOR TREATING SURFACE THEREOF

CROSS-REFERENCE TO RELATED APPLICATION

This application claims under 35 U.S.C. §119(a) the benefit of Korean Patent Application No. 10-2012-0021507 filed Feb. 29, 2012, the entire contents of which are incorporated herein by reference.

BACKGROUND (a) Technical Field

The present invent relates to a valve for an engine and a method for treating the surface of the valve. More particularly, it relates to a valve for an engine and a method for treating the surface of the valve by forming a coating layer with improved abrasion resistance, heat resistance, and low friction characteristics on the surface of a base material. The present invention can, thus, ensure the quality of a valve and can further reduce abrasion of a valve guide.

(b) Background Art

Recently, in keeping with the "eco-friendly" megatrend of next-generation automobile industries, various eco-friendly vehicles are being developed aiming at reducing $CO_2$ emission to about 50 g/km which is about 35% to 50% of the current level until 2020.

Also, vehicle manufacturers are trying to develop technologies of downsizing vehicles and improving the fuel efficiency to meet 54.5 mpg (23.2 km/L) regulations by 2025 in accordance with U.S. Corporate Average Fuel Economy (CAFE).

However, since technology such as downsizing increases loads applied to engine parts, quality reduction may result due to friction and abrasion of parts, and the duration of parts may be shortened.

These limitations have also been demonstrated in valve systems applied to vehicle engines.

As is well known, intake/exhaust valves of valve systems for vehicle engines are parts for opening/closing a combustion chamber of the engines by vertically reciprocating according to the rotary movement of a camshaft.

Intake valves open or close intake ports of the engines such that a mixture of fuel and air is supplied into a combustion chamber at an appropriate moment, and exhaust valves open or close exhaust ports such that a combustion gas is exhausted from the combustion chamber at an appropriate moment.

The intake/exhaust valves are inserted into hollow valve guides fixed to each port, and reciprocate therein. In this case, the valve guide may guide the reciprocating movement of the valve while contacting a stem part of the valve.

Referring to FIG. 1, generally, as a surface treatment method for an exhaust valve of an engine, a high frequency process is performed on a tip part 12, i.e., an upper end of a valve 10, and then a Cr plating process is performed on a stem part 11 that is in frictional contact with a valve guide.

In this case, the Cr plating is performed over the stem part 11 including the tip part 12 on which the high frequency process has been performed.

However, since the stem part 11 of the valve 10 plated with Cr produces friction with the inner circumferential surface of the valve guide, the inner circumferential surface of the valve guide may be abraded. Particularly, when the inner circumferential surface of the valve guide is abraded to a certain level or more due to longtime engine driving, the valve may move horizontally during the vertical reciprocating movement.

This horizontal motion results in a limitation in opening/closing the valve, and as abrasion continues, the movement of the valve becomes more unstable.

Thus, a method for preventing this abrasion is needed.

The above information disclosed in this Background section is only for enhancement of understanding of the background of the invention and therefore it may contain information that does not form the prior art that is already known in this country to a person of ordinary skill in the art.

SUMMARY OF THE DISCLOSURE

The present invention provides a valve of an engine and a method for treating the surface of the valve by forming a coating layer with improved abrasion resistance, heat resistance, and low friction characteristics on the surface of a base material of the valve. This method and resulting valve can ensure the quality of the valve and, further, can reduce abrasion of a valve guide that is in frictional contact with the valve.

In one aspect, the present invention provides a valve for an engine, including: a stem part having a buffer layer coated over its surface as a lowermost layer; an intermediate layer coated over the buffer layer; a first nanostructured multilayer coated over the intermediate layer; and a second nanostructured multilayer coated over the first nanostructured multilayer as an uppermost layer. In an exemplary embodiment, the buffer layer is formed of Ti and Cr, the intermediate layer is formed of CrN, TiN, or TiCN, the first nanostructured multilayer is formed of TiAlN/CrN, and the second nanostructured multilayer is formed of TiAlCN/CrCN.

In an exemplary embodiment, the second nanostructured multilayer may be formed of TiAlCN/CrCN and may include TiAlCN nanostructured layers and CrCN nanostructured layers coated repeatedly in an alternating fashion. Any number of alternating layers can be provided in suitable thicknesses, with the TiAlCN nanostructured layers and CrCN nanostructured layers being equal to each other and constant in thickness or having varying thicknesses.

In another exemplary embodiment, the second nanostructured multilayer is formed of TiAlCN/CrCN and may have a thickness of about 0.1 μm to about 10 μm, in which TiAlCN nanostructured layers and CrCN nanostructured layers having individual thicknesses of about 10 nm to about 50 nm are alternately and repeatedly coated. In some embodiments, these layers are generally constant in thickness throughout the second nanostructured layer. Of course, there can be variations in thicknesses among the layers within the noted thickness range, if desired.

In still another exemplary embodiment, the first nanostructured multilayer is formed of TiAlN/CrN and may include TiAlN nanostructured layers and CrN nanostructured layers having a thickness of about 10 nm to about 50 nm, which are coated repeatedly in an alternating fashion. As with the first nanostructured multilayer, any number of alternating layers can be provided in suitable thicknesses, with the TiAlN nanostructured layers and CrN nanostructured layers being equal to each other and constant in thickness or having varying thicknesses.

In another aspect, the present invention provides a method for treating a surface of a valve for an engine, including: coating a buffer layer formed of Ti or Cr over a surface of a stem part of the valve; coating an intermediate layer formed of CrN, TiN, or TiCN over the buffer layer; coating a TiAlN/CrN first nanostructured layer over the intermediate layer; and coating a TiAlCN/CrCN second nanostructured layer over the TiAlN/CrN first nanostructured layer.

Other aspects and exemplary embodiments of the invention are discussed infra.

BRIEF DESCRIPTION OF THE DRAWINGS

The above and other features of the present invention will now be described in detail with reference to certain exemplary embodiments thereof illustrated the accompanying drawings which are given hereinbelow by way of illustration only, and thus are not limitative of the present invention, and wherein.

Figure 1:
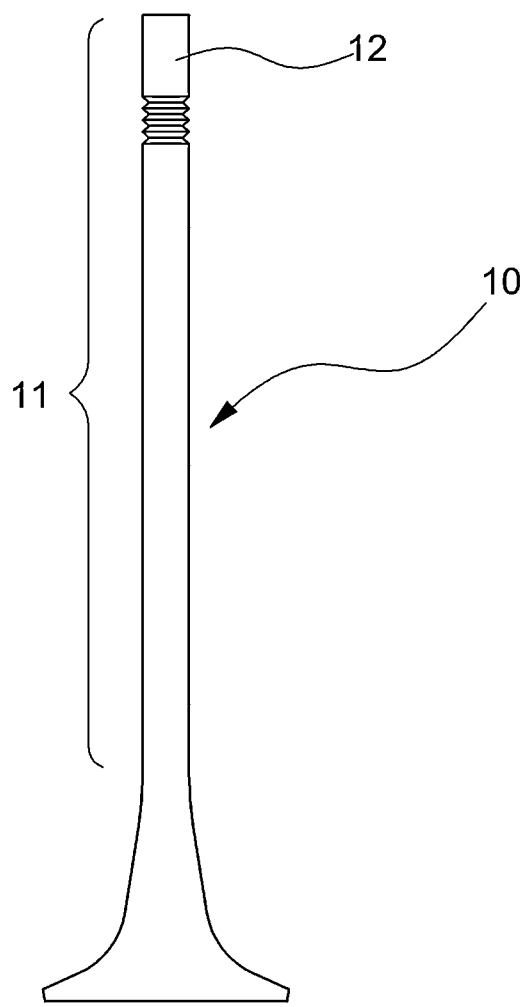
FIG. 1 is a view illustrating a typical surface treatment part and a typical surface treatment method.

Reference numerals set forth in the Drawings includes reference to the following elements as further discussed below:

10: valve
11: stem part
12: tip part
14: buffer layer
15: intermediate layer
16: first nanostructured multilayer
16a: TiAlN nanostructured layer
16b: CrN nanostructured layer
17: second nanostructured multilayer (uppermost surface layer)
17a: TiAlCN nanostructured layer
17b: CrCN nanostructured layer It should be understood that the appended drawings are not necessarily to scale, presenting a somewhat simplified representation of various preferred features illustrative of the basic principles of the invention. The specific design features of the present invention as disclosed herein, including, for example, specific dimensions, orientations, locations, and shapes will be determined in part by the particular intended application and use environment.

In the figures, reference numbers refer to the same or equivalent parts of the present invention throughout the several figures of the drawing.

DETAILED DESCRIPTION

Hereinafter reference will now be made in detail to various embodiments of the present invention, examples of which are illustrated in the accompanying drawings and described below. While the invention will be described in conjunction with exemplary embodiments, it will be understood that present description is not intended to limit the invention to those exemplary embodiments. On the contrary, the invention is intended to cover not only the exemplary embodiments, but also various alternatives, modifications, equivalents and other embodiments, which may be included within the spirit and scope of the invention as defined by the appended claims.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g., fuels derived from resources other than petroleum). As referred to herein, a hybrid vehicle is a vehicle that has two or more sources of power, for example both gasoline-powered and electric-powered vehicles.

The above and other features of the invention are discussed infra.

Hereinafter, exemplary embodiments of the present invention will be described in detail with reference to the accompanying drawings.

The present invention relates to a valve for a vehicle engine and a method for treating the surface of the valve, which is characterized in forming a coating layer on a valve, thereby providing improved abrasion resistance, heat resistance, and lowering friction with a valve guide that is a counterpart in friction/abrasion.

Figure 2:
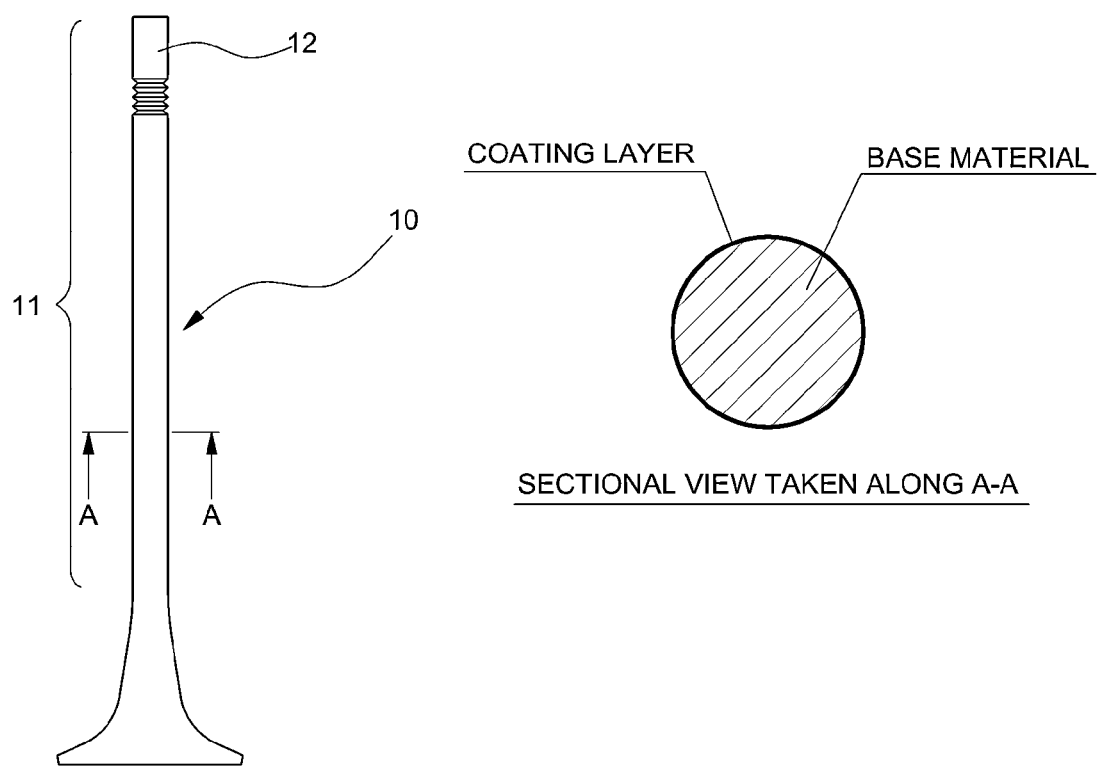
FIG. 2 is a view illustrating a surface treatment part according to an embodiment of the present invention.

In order to effectively maintain airtightness of a valve by reducing abrasion of a valve guide caused by friction with the valve, a coating layer may be formed on the surface of a stem part 11 of a valve 12 (see cross-sectional view of FIG. 2). The coating layer may be provided with low friction characteristics that can reduce aggressiveness of the valve against the valve guide due to friction therebetween.

Valves of an engine may require heat resistance against a high temperature, such as a temperature of about 450° C. or more, and may require abrasion resistance.

Thus, in order to increase heat resistance and abrasion resistance, a coating layer including a TiAlCN/CrCN second nanostructured multilayer may be coated on the surface of the stem part (including a tip part) 11 that is formed of a base material. The base material can be any commonly used base material used to form such stem parts. The coating layer may provide heat resistance and abrasion resistance of the valve, and also lower friction with the valve guide that is a counterpart in friction/abrasion.

Figure 3:
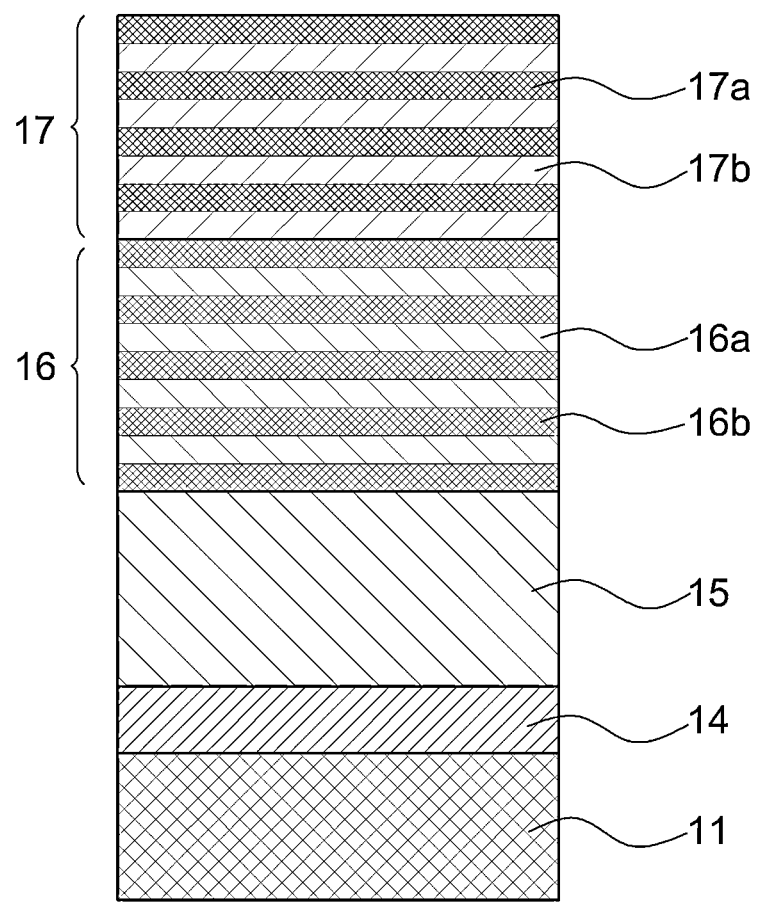
FIG. 3 is a cross-sectional view illustrating the structure of a coating layer of a valve according to an embodiment of the present invention.

More specifically, according to embodiments of the present invention as shown in FIG. 3, the coating layer may include a Ti or Cr buffer layer 14, an intermediate layer 15, a TiAlN/CrN first nanostructured multilayer 16, and a TiAlCN/CrCN second nanostructured multilayer 17. The Ti or Cr buffer layer 14 may be a lowermost layer coated on the surface of the stem part 11. The intermediate layer 15 may be coated on the Ti or Cr buffer layer 14, and may be formed of CrN, TiN, or TiCN. The TiAlN/CrN first nanostructured multilayer 16 may be coated on the intermediate layer 15. The TiAlCN/CrCN second nanostructured multilayer 17 may be coated on the TiAlN/CrN first nanostructured multilayer 16 as an uppermost surface layer.

The total thickness of the coating layer, including the buffer layer 14, intermediate layer 15, first nanostructured multilayer 16, and second nanostructured multilayer 17 may range from about 0.31 μm to about 25.5 μm.

The buffer layer 14 formed on the surface of the stem part 11 as the lowermost layer may serve to reduce and control the residual stress of coating, and may serve as a bonding layer with the base material, i.e., the stem part 11. Accordingly, the buffer layer 14 may be formed of Ti or Cr with a strong adhesion strength with the base material. Other similar materials which provide these properties could also suitably be used, if desired.

In an exemplary embodiment, the thickness of the buffer layer 14 may range from about 0.01 μm to about 0.5 μm to reduce the residual stress and provide excellent bonding strength.

When the thickness of the buffer layer 14 is smaller than about 0.01 μm, the adhesion strength of the coating layer may be reduced. On the other hand, when the thickness of the buffer layer 14 is greater than about 0.5 μm, the soft buffer layer 14 may be thickened. Accordingly, the fatigue resistance and the shock resistance of the whole coating layer may be reduced if the thickness of the buffer layer 14 is outside of the noted range.

The CrN or Ti(C)N intermediate layer 15 coated on the buffer layer 14 may provide toughness, fatigue resistance, and shock resistance. Accordingly, the intermediate layer 15 may have a thickness of about 0.1 μm to about 0.5 μm to meet such characteristics.

In this case, when the thickness of the intermediate layer 15 is smaller than about 0.1 μm, the fatigue resistance and the shock resistance may be insufficient. Also, when the thickness of the intermediate layer 15 is greater than about 0.1 μm, its own residual stress may increase, reducing the fatigue resistance and the shock resistance for the intermediate layer 15.

Also, the first nanostructured multilayer 16 may include TiAlN nanostructured layers 16a formed of TiAlN and CrN nanostructured layers 16b formed of CrN, which are alternately and repeatedly stacked therein. The first nanostructured multilayer may contain heat-resistant elements (e.g., TiAl and Cr) with excellent heat resistance and abrasion resistance, and may provide excellent toughness. The total thickness of the first nanostructured multilayer 16 may range from about 0.1 μm to about 10 μm.

When the total thickness of the first nanostructured multilayer 16 is smaller than about 0.1 μm, the heat resistance and the abrasion resistance may be insufficient. Also, when the total thickness of the first nanostructured multilayer 16 is greater than about 10 μm, its own residual stress may increases. Accordingly, if the thickness of the thin layer is not within the noted range, it may be damaged due to fatigue and shock.

The thickness of each nanostructured layer 16a and 16b may be provided in to suitably provide heat resistance and the abrasion resistance (or high hardness). To provide such characteristics, thicknesses of each layer ranging from about 10 nm to about 50 nm have been found to be suitable.

When the thickness of each nanostructured layer 16a and 16b is smaller than about 10 nm, the nanostructured layer may be unstable, and thus the heat resistance and the hardness may be reduced. Also, when the thickness of each nanostructured layer 16a and 16b is greater than about 50 nm, the TiAlN nanostructured layer and the CrN nanostructured layer may not be well-matched with each other, and thus the heat resistance and the hardness may also be reduced.

The number of the nanostructured layers 16a and 16b constituting the first nanostructured multilayer 16 are not limited.

The TiAlCN/CrCN second nanostructured layer 17 containing carbon (C) with excellent low friction characteristics may be the uppermost surface layer of the coating layer. In various embodiments, carbon may be added to the TiAlCN/CrCN second nanostructured layer 17 at levels of about 5 at % to about 30 at %. According to various embodiments, the thickness of the TiAlCN/CrCN second nanostructured layer 17 may range from about 0.1 μm to about 10 μm.

When the thickness of the TiAlCN/CrCN second nanostructured layer 17 is smaller than about 0.1 μm, the low friction characteristics may be insufficient. Also, when the thickness of the TiAlCN/CrCN second nanostructured layer 17 is greater than about 10 μm, the residual stress may increase, and thus the thin layer may be damaged due to fatigue and shock.

When the content of carbon contained in the TiAlCN/CrCN second nanostructured layer 17 is smaller than about 5 at %, the TiAlCN/CrCN second nanostructured layer 17 may be changed into a crystalline or polycrystalline texture, which can result in a reduction in the hardness of the layer. Also, when the content of carbon contained in the TiAlCN/CrCN second nanostructured layer 17 is greater than about 30 at %, the TiAlCN/CrCN second nanostructured layer 17 may be changed into an amorphous texture, which also can reduce the hardness of the layer.

The TiAlCN/CrCN second nanostructured layer 17 may include TiAlCN nanostructured layers 17a and CrCN nanostructured layers 17b that are coated repeatedly in an alternating fashion. The thickness of the TiAlCN nanostructured layer 17a and the CrCN nanostructured layer 17b may vary, and in various embodiments, may range from about 10 nm to about 50 nm, respectively. According to embodiments of the invention, the total thickness of the TiAlCN/CrCN second nanostructured layer 17 may range from about 0.1 μm to about 10 μm. Thus, for example, any combination of thicknesses and numbers of alternating layers could be suitably selected to provide the desired total thickness of the second nanostructured layer 17.

Hereinafter, a method for coating a valve according to an embodiment of the present invention will be described.

Physical Vapor Deposition (hereinafter, referred to as PVD), which is well-known as a method for forming a thin film, may be used to form layers in a coating layer according to an embodiment of the present invention. The general steps and conditions for carrying out the PVD process to form the various layers of the present invention can be suitably selected based on these known methods.

Examples of available PVD coating methods include arch methods for generating high density plasma to implement nanosizing of coating material particles and high speed coating, High Power Impulse Magnetron Sputtering (HIPIMS), and Inductively Coupled Plasma (ICP) Magnetron Sputtering, and the present method can use any of these as desired.

Figure 4:
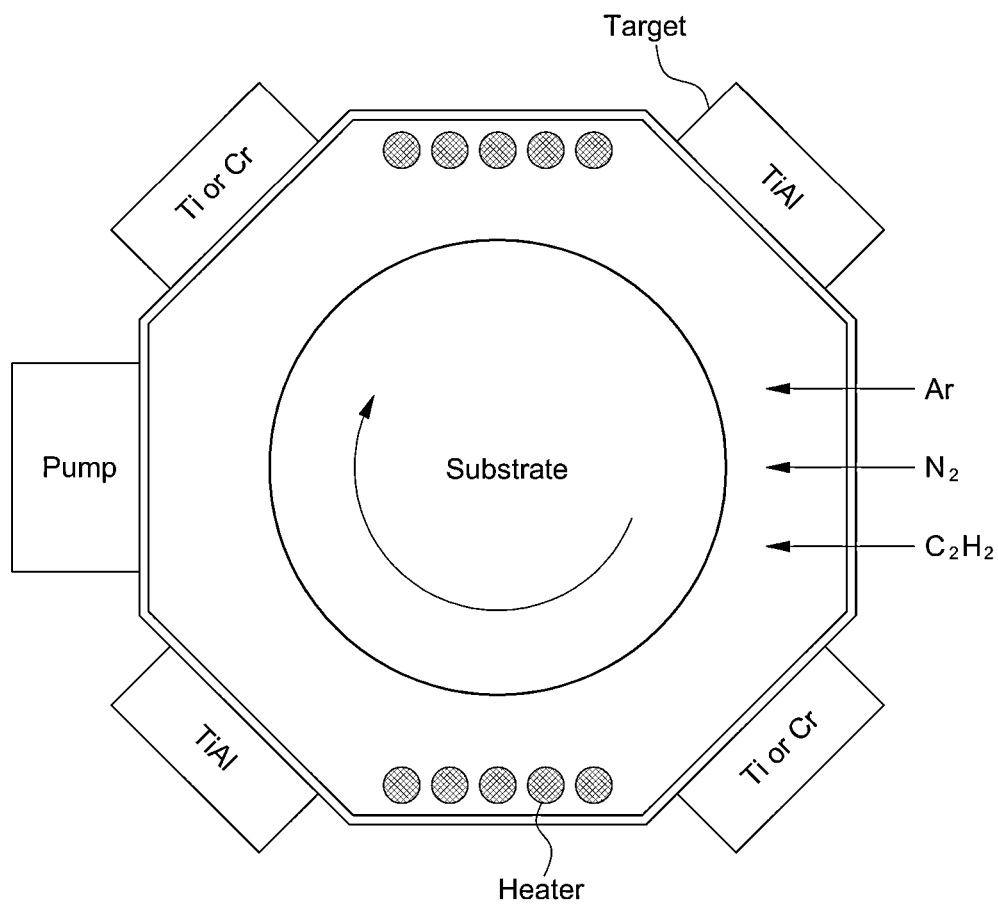
FIG. 4 is a view illustrating a PVD coating apparatus for a surface treating process according to an embodiment of the present invention.

FIG. 4 is a view illustrating a PVD coating apparatus for a surface treating process according to an embodiment of the present invention. As shown in FIG. 4, coating may be performed in a vacuum coating apparatus that uses a Ti or Cr target and a TiAl target, and Ar, N2 and hydrocarbon process gas (CξHψ, for example, C2H2) like a PVD.

The layers in the coating layer described above may be sequentially coated on the surface of the valve by the PVD coating apparatus. First, in a vacuum state prior to coating, a plasma state may be prepared using Ar gas, and then a coating chamber may be heated to a suitable temperature, such as a temperature of about 80° C., to activate the surface of the valve stem part 11. Also, the valve surface may be cleaned by applying a bias while allowing Ar ions to collide with the surface (baking & cleaning).

Thereafter, the buffer layer 14 may be coated to provide an adhesion strength with the valve base material and reduce the residual stress of the coating. For the buffer layer 14, a Ti layer or a Cr layer may be coated on the surface of the stem part 11 of the valve using only a Ti or Cr target.

Next, a process gas N2 may be introduced into the chamber to coat the intermediate layer 15 taking charge of toughness, fatigue resistance, and shock resistance. In this case, the process gas N2 may react with Cr ions from the Cr target to coat a CrN layer, or C2H2 and N2 may be together introduced to react with Ti ions from the Ti target and thus coat a TiN layer or a TiCN layer.

Next, the TiAlN/CrN first nanostructured multilayer 16, which provides excellent toughness and which contains heat-resistant elements (TiAl and Cr) with excellent heat resistance and abrasion resistance, may be coated on the intermediate layer 15. For this step, the TiAlN nanostructured layer 16a and the CrN nanostructured layer 16b may be alternately and repeatedly coated in a suitable thickness, such as a thickness of about 10 nm to about 50 nm, using the TiAl target and the Cr target, and the process gas N2. The total thickness of the first nanostructured multilayer 16 may range from about 0.1 μm to about 10 μm.

Next, the TiAlCrCN (C: about 5 at % to about 30 at %) uppermost surface layer 17 containing carbon with excellent low friction characteristics may be coated on the first nanostructured multilayer 16. For this step, the TiAlCN nanostructured layer 17a and the CrCN nanostructured layer 17b may be alternately and repeatedly coated in a suitable thickness, such as a thickness of about 10 nm to about 50 nm, using the TiAl target and the Cr target, and the process gases C2H2 and N2. The total thickness of the second nanostructured multilayer 17 may range from about 0.1 μm to about 10 μm.

Thus, since the TiAlN/CrN first nanostructured multilayer 16 with excellent toughness and heat-resistant elements (TiAl and Cr) with excellent heat resistance and abrasion resistance is coated in the coating layer of the stem part of the valve, and the TiAlCN/CrCN second nanostructured multilayer 17 containing carbon (C) with excellent low friction characteristics is coated at the uppermost surface of the stem part of the valve, the heat resistance against a high temperature, such as a temperature of at least 600° C., the abrasion resistance, and the low friction characteristics can be secured in the thus formed valve.

Particularly, the TiAlCN/CrCN second nanostructured multilayer 17 can prevent the low friction characteristics from being reduced, which typically results due to a rise in temperature caused by friction.

Hereinafter, an exemplary embodiment of the present invention will be described in more detail.

Embodiment

An exhaust valve for a diesel engine was manufactured, and then a coating layer was formed on the surface of the stem part 11 that is formed from a base material, in accordance with the above-described surface treatment method (coating method). The Cr buffer layer 14 with a thickness of about 0.5 μm, the CrN intermediate layer 15 with a thickness of about 5 μm, the TiAlN/CrN first nanostructured multilayer 16 with a total thickness of about 2.5 μm, the TiAlCN/CrCN second nanostructured multilayer 17 with a total thickness of about 2.5 μm were sequentially coated on the surface of the base material. The texture of the thus formed coating layer is shown in FIGS. 5 and 6.

Figure 5:
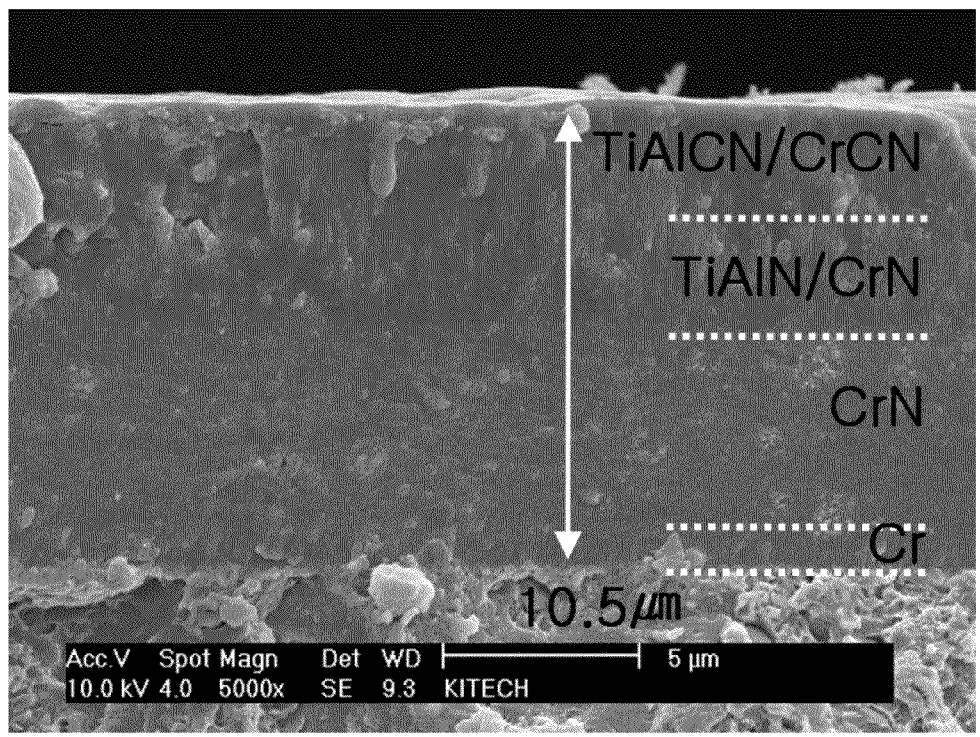
FIG. 5 is a view illustrating the texture of a coating layer according to an embodiment of the present invention.
Figure 6:
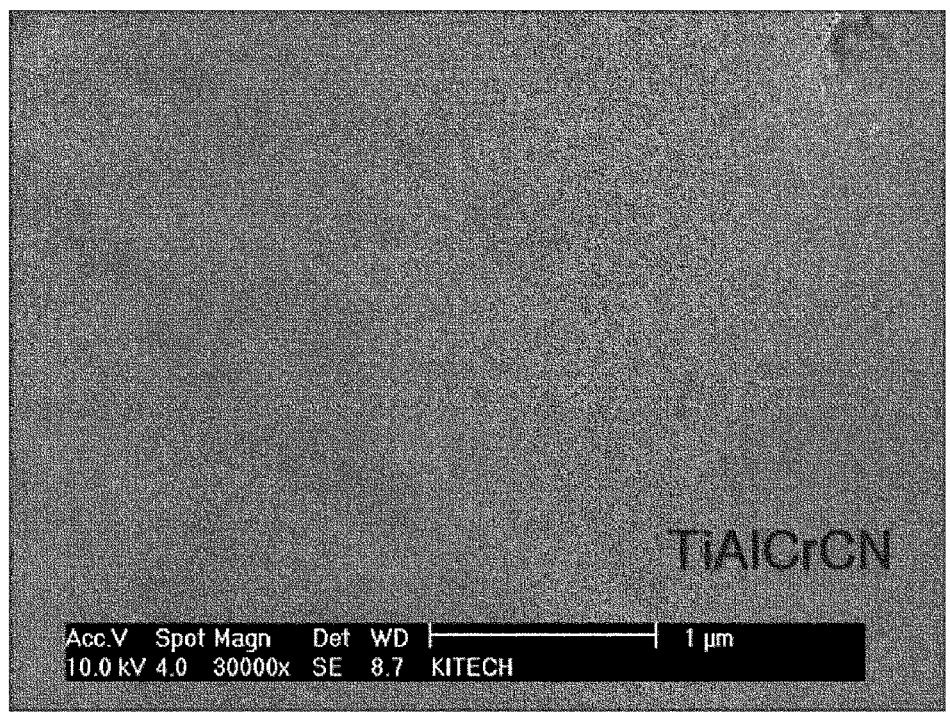
FIG. 6 is a view illustrating a TiAlCN/CrCN second nanostructured multilayer that is the uppermost surface layer of a coating layer according to an embodiment of the present invention.

FIG. 5 is a view illustrating the texture of the coating layer according to this embodiment. FIG. 6 is a view illustrating the TiAlCN/CrCN second nanostructured multilayer that is the uppermost surface layer of the coating layer according to this embodiment.

The bonding strength, the hardness, the friction coefficient, and the abrasion resistance were measured with respect to a coated sample, and were compared with those of a sample of a typical valve as a comparative example with respect to various items. The measurement results are shown in Table 1 below.

TABLE 1

|  | Comparative Example | Embodiment of the Present Invention |
|---|---|---|
| Surface Treatment | Cr plating | TiAlCrCN coating (uppermost surface layer) |
| Processing Method | Wet plating | PVD |
| Thickness (μm) | 4 | 10.5(0.5Cr—5CrN—2.5TiAlCrN—2.5TiAlCrCN) |
| Adhesion Strength (N) | 50 | 50 |
| Hardness (HV) | 860 | 3.458 |
| Friction Coefficient (Dry) | 0.5 | 0.35 |
| High Temperature Abrasion Resistance (μm/h) | 2.0 | 0.5 |

The friction coefficient was measured by generating friction between a sample of a valve guide material and a coated surface of a sample of the embodiment or a plated surface of a sample of the comparative example using a plate-on-disc friction/abrasion tester. The test was performed under the dry conditions of load of about 10 N, distance of about 2000 m, radius of about 6 mm, and linear velocity of about 100 mm/s.

The high temperature abrasion resistance was measured using a reciprocating friction/abrasion tester. The coated surface of the sample of the embodiment and the plated surface of the sample of the comparative example were rubbed against the sample of the valve guide material through a reciprocating sliding method, and the test was performed for about 1 hour under the oil condition of load of about 150 N, temperature of about 450° C., and reciprocating period of about 5 Hz.

As shown in Table 1, the friction coefficient of TiAlCrCN in the sample of the embodiment is 30% lower than that of Cr plating. Accordingly, the abrasion of the valve guide in frictional contact with a valve in accordance with the present invention would be reduced as compared to that of the Comparative Example.

As further demonstrated, the abrasion resistance of TiAlCrCN in the sample of the embodiment was superior to (at least two times greater than) the Cr plating (2 μm/h→0.5 μm/h). Since elements with excellent heat resistance are coated, the heat resistance against a temperature of 600° C. or more can be secured to improve the heat resistance and the low friction characteristics compared to typical Cr plating (reduction of low friction characteristics due to temperature rising caused by friction can be prevented).

Also, while maintaining and securing the above characteristics of a valve according to an embodiment of the present invention, additional advantages, such as omitting a high frequency processing on a tip part, can be achieved.

According to embodiments, heat resistance, abrasion resistance, and the low friction characteristics can be together secured by coating a TiAlN/CrN first nanostructured multilayer with excellent heat resistance, abrasion resistance, and toughness on the surface of a stem part of a valve and coating a TiAlCN/CrCN second nanostructured multilayer with excellent low friction characteristics on the uppermost surface of the stem part.

Thus, abrasion of the valve and the valve guide due to friction can be significantly reduced, and also the lifespan thereof can be extended. Also, the airtightness of the valve can be improved.

Also, since a typical high frequency process on a tip part and a typical Cr plating process on a stem part can be all substituted with the present coating process, the total process can be reduced and simplified.

The valve and the method for treating the surface of the valve can be usefully applied to exhaust valves for vehicle engines, particularly, exhaust valves for diesel engines and methods for manufacturing the exhaust valves.

The invention has been described in detail with reference to exemplary embodiments thereof. However, it will be appreciated by those skilled in the art that changes may be made in these embodiments without departing from the principles and spirit of the invention, the scope of which is defined in the appended claims and their equivalents.

What is claimed is:

1. A valve for an engine, comprising:
    a stem part;
    a buffer layer coated on an outer surface of the stem part, the buffer layer formed of Ti or Cr;
    an intermediate layer coated on the buffer layer, the intermediate layer formed of CrN, TiN, or TiCN;
    a TiAlN/CrN first nanostructured multilayer coated on the intermediate layer; and
    a TiAlCN/CrCN second nanostructured multilayer coated on the TiAlN/CrN first nanostructured multilayer.

2. The valve for the engine of claim 1, wherein the TiAlCN/CrCN second nanostructured multilayer comprises alternating layers of TiAlCN nanostructured layers and CrCN nanostructured layers.

3. The valve for the engine of claim 2, wherein the TiAlCN/CrCN second nanostructured multilayer has a total thickness of about 0.1 µm to about 10 µm, and wherein the TiAlCN nanostructured layers and the CrCN nanostructured layers each have a thickness of about 10 nm to about 50 nm.

4. The valve for the engine of claim 1, wherein:
    a thickness of the buffer layer ranges from about 0.01 µm to about 0.5 µm;
    a thickness of the intermediate layer 15 ranges from about 0.1 µm to about 5 µm; and
    a thickness of the TiAlN/CrN first nanostructured multilayer ranges from about 0.1 µm to about 10 µm.

5. The valve for the engine of claim 4, wherein the TiAlN/CrN first nanostructured multilayer comprises TiAlN nanostructured layers and CrN nanostructured layers having a thickness of about 10 nm to about 50 nm, which are coated repeatedly in an alternate fashion.

6. The valve for the engine of claim 1, wherein the total thickness of the coating layer ranges from about 0.31 µm to about 25.5 µm.

7. The valve for the engine of claim 1, wherein the TiAlN/CrN first nanostructured multilayer comprises TiAlN nanostructured layers and CrN nanostructured layers having a thickness of about 10 nm to about 50 nm, which are coated repeatedly in an alternate fashion.

8. The valve for the engine of claim 1, wherein the TiAlCN/CrCN second nanostructured multilayer comprises carbon in the amount of about 5 at % to about 30 at %.

9. A method for treating a surface of a valve for an engine, comprising:
    coating a Ti or Cr buffer layer on an outer surface of a stem part of the valve;
    coating a CrN, TiN, or TiCN intermediate layer on the buffer layer;
    coating a TiAlN/CrN first nanostructured layer on the intermediate layer; and
    coating a TiAlCN/CrCN second nanostructured layer on the TiAlN/CrN first nanostructured layer.

10. The method of claim 9, wherein the step of coating the TiAlCN/CrCN second nanostructured multilayer comprises coating alternating TiAlCN nanostructured layers and CrCN nanostructured layers.

11. The method of claim 10, wherein the TiAlCN/CrCN second nanostructured multilayer is coated to a thickness of about 0.1 µm to about 10 µm, in which each of the TiAlCN nanostructured layers and CrCN nanostructured layers are coated to a thickness of about 10 nm to about 50 nm.

12. The method of claim 11, wherein the step of coating the TiAlN/CrN first nanostructured multilayer comprises coating alternating TiAlN nanostructured layers and CrN nanostructured layers, wherein each of the TiAlN nanostructured layers and CrN nanostructured layers are coated to a thickness of about 10 nm to about 50 nm.

13. The method of claim 9, wherein:
    the buffer layer, the intermediate layer, the TiAlN/CrN first nanostructured multilayer, and the TiAlCN/CrCN second nanostructured multilayer are coated to form a total coating layer having a thickness of about 0.31 µm to about 25.5 µm;
    the buffer layer is coated to a thickness of about 0.01 µm to about 0.5 µm;
    the intermediate layer is coated to a thickness of about 0.1 µm to about 5 µm; and
    the TiAlCN/CrCN second nanostructured multilayer is coated to a thickness of about 0.1 µm to about 10 µm.

14. The method of claim 9, wherein the step of coating the TiAlN/CrN first nanostructured multilayer comprises coating alternating TiAlN nanostructured layers and CrN nanostructured layers, wherein each of the TiAlN nanostructured layers and CrN nanostructured layers are coated to a thickness of about 10 nm to about 50 nm.

15. The method of claim 9, wherein the TiAlCN/CrCN second nanostructured multilayer comprises carbon in the amount of about 5 at % to about 30 at %.

* * * * *